United States Patent
Wu et al.

(10) Patent No.: US 9,159,863 B2
(45) Date of Patent: Oct. 13, 2015

(54) METHOD OF FORMING CHALCOPYRITE THIN FILM SOLAR CELL

(71) Applicant: TSMC Solar Ltd., Taichung (TW)

(72) Inventors: Chung-Hsien Wu, Luzhu Township (TW); Wen-Chin Lee, HsinChu (TW)

(73) Assignee: TSMC Solar Ltd., Taichung (TW)

( * ) Notice: Subject to any disclaimer, the term of this patent is extended or adjusted under 35 U.S.C. 154(b) by 152 days.

(21) Appl. No.: 13/967,549

(22) Filed: Aug. 15, 2013

(65) Prior Publication Data

US 2015/0050772 A1    Feb. 19, 2015

(51) Int. Cl.
*H01L 21/00* (2006.01)
*H01L 31/18* (2006.01)

(52) U.S. Cl.
CPC ..................... *H01L 31/18* (2013.01)

(58) Field of Classification Search
CPC ........................................... H01L 31/18
See application file for complete search history.

(56) References Cited

U.S. PATENT DOCUMENTS

| | | | | |
|---|---|---|---|---|
| 6,500,733 B1 * | 12/2002 | Stanbery | 438/459 |
| 6,559,372 B2 * | 5/2003 | Stanbery | 136/252 |
| 6,593,213 B2 * | 7/2003 | Stanbery | 438/478 |
| 6,787,012 B2 * | 9/2004 | Stanbery | 204/298.24 |
| 6,881,647 B2 * | 4/2005 | Stanbery | 438/455 |
| 7,148,123 B2 * | 12/2006 | Stanbery | 438/455 |
| 7,163,608 B2 * | 1/2007 | Stanbery | 204/298.24 |
| 7,767,904 B2 * | 8/2010 | Stanbery | 136/265 |
| 8,084,685 B2 * | 12/2011 | Stanbery | 136/263 |
| 8,647,533 B2 * | 2/2014 | Stanbery | 252/500 |
| 8,865,506 B1 * | 10/2014 | Pethuraja et al. | 438/67 |
| 2003/0052382 A1 * | 3/2003 | Stanbery | 257/436 |
| 2008/0311028 A1 * | 12/2008 | Stanbery | 423/508 |
| 2010/0218820 A1 * | 9/2010 | Kim et al. | 136/256 |
| 2013/0164885 A1 * | 6/2013 | Liang et al. | 438/95 |
| 2013/0164918 A1 * | 6/2013 | Liang et al. | 438/478 |
| 2013/0217176 A1 * | 8/2013 | Munteanu et al. | 438/95 |
| 2013/0217177 A1 * | 8/2013 | Wong et al. | 438/95 |
| 2013/0217214 A1 * | 8/2013 | Munteanu et al. | 438/479 |
| 2014/0170805 A1 * | 6/2014 | Miller et al. | 438/95 |
| 2014/0179053 A1 * | 6/2014 | Wu et al. | 438/84 |
| 2014/0209161 A1 * | 7/2014 | Sang et al. | 136/256 |
| 2014/0366946 A1 * | 12/2014 | Sang et al. | 136/262 |
| 2015/0000742 A1 * | 1/2015 | Lu et al. | 136/262 |
| 2015/0050772 A1 * | 2/2015 | Wu et al. | 438/95 |

FOREIGN PATENT DOCUMENTS

WO   WO 2014028542 A1 *   2/2014

* cited by examiner

*Primary Examiner* — Laura Menz
(74) *Attorney, Agent, or Firm* — Duane Morris LLP

(57) ABSTRACT

In a method of forming a CIGS film absorption layer, a first precursor is provided including a first substrate having a major process precursor film formed thereon, the major process precursor film containing two or more of Cu, In, Ga, and Se. A second precursor is provided including a second substrate having an element supplying precursor film formed thereon, the element supply precursor film containing two or more of Cu, In, Ga and Se. The precursors are oriented with the major process precursor film and element supplying precursor film facing one another so as to allow diffusion of elements between the films during annealing. The oriented films are annealed and then the precursors are separated, wherein the CIGS film is formed over the first substrate and either a CIGS film or a precursor film containing two or more of Cu, In, Ga, and Se remains over the second substrate.

21 Claims, 6 Drawing Sheets

METHOD OF FORMING CHALCOPYRITE THIN FILM SOLAR CELL

BACKGROUND

Copper indium gallium (di)selenide (CIGS) is a I-III-VI$_2$ semiconductor material composed of copper, indium, gallium, and selenium. The material is a solid solution of copper indium selenide (often abbreviated "CIS") and copper gallium selenide. It has a chemical formula of CuIn$_x$Ga$_{(1-x)}$Se$_2$ where the value of x can vary from 1 (pure copper indium selenide) to 0 (pure copper gallium selenide). CIGS is a tetrahedrally bonded semiconductor, with the chalcopyrite crystal structure. Its bandgap varies continuously with x from about 1.0 eV (for copper indium selenide) to about 1.7 eV (for copper gallium selenide).

Optoelectronic devices, such as photovoltaic devices (e.g., solar cells), require an optical absorber that also provides sufficiently long minority carrier lifetimes to enable the collection of the minority carriers by the electrodes in the device's structure without excessive recombination. In all semiconductor materials minority carrier lifetimes are dependent on the defect structure of those materials. The control of defect structure is critical to the successful manufacture of photovoltaic devices.

Thin film optical absorbers are more economical than thick film absorbers or coatings because they require a smaller amount of the precursor materials than thick films or coatings. CIGS are well-suited to thin film solar cells since they can be deposited on flexible substrate materials, producing highly flexible, lightweight solar panels. Various techniques have been proposed in the art for forming CIGS absorption layers for photovoltaic devices such as solar cells. Currently, most CIGS deposition is done either using co-evaporation or using selenization of metal precursors, both of which have their disadvantages. For example, co-evaporation has proved difficult to effectively commercialize because it is difficult to uniformly evaporate Cu, In and Ga metal elements over a wide area. Moreover, the melting point of copper is 1084° C., which leads to high process costs and affects the substrate temperature. For this reason, sputtering techniques for selenization of metal precursor are more widely used for production. However, the reaction pathway cannot be controlled with these selenization techniques, resulting in copper selenide compounds forming after selenization and/or uneven gallium distribution, which decreases device performance. Further sulfurization is required to finish the surface passivation. Still further, this technique requires large amounts of toxic and costly H$_2$Se gas or a large amount of Se.

An alternative technique using release liners is described in U.S. Pat. No. 6,559,372 to Stanbery.

BRIEF DESCRIPTION OF THE DRAWINGS

The following will be apparent from elements of the figures, which are provided for illustrative purposes and are not necessarily to scale.

DETAILED DESCRIPTION

Figure 1:
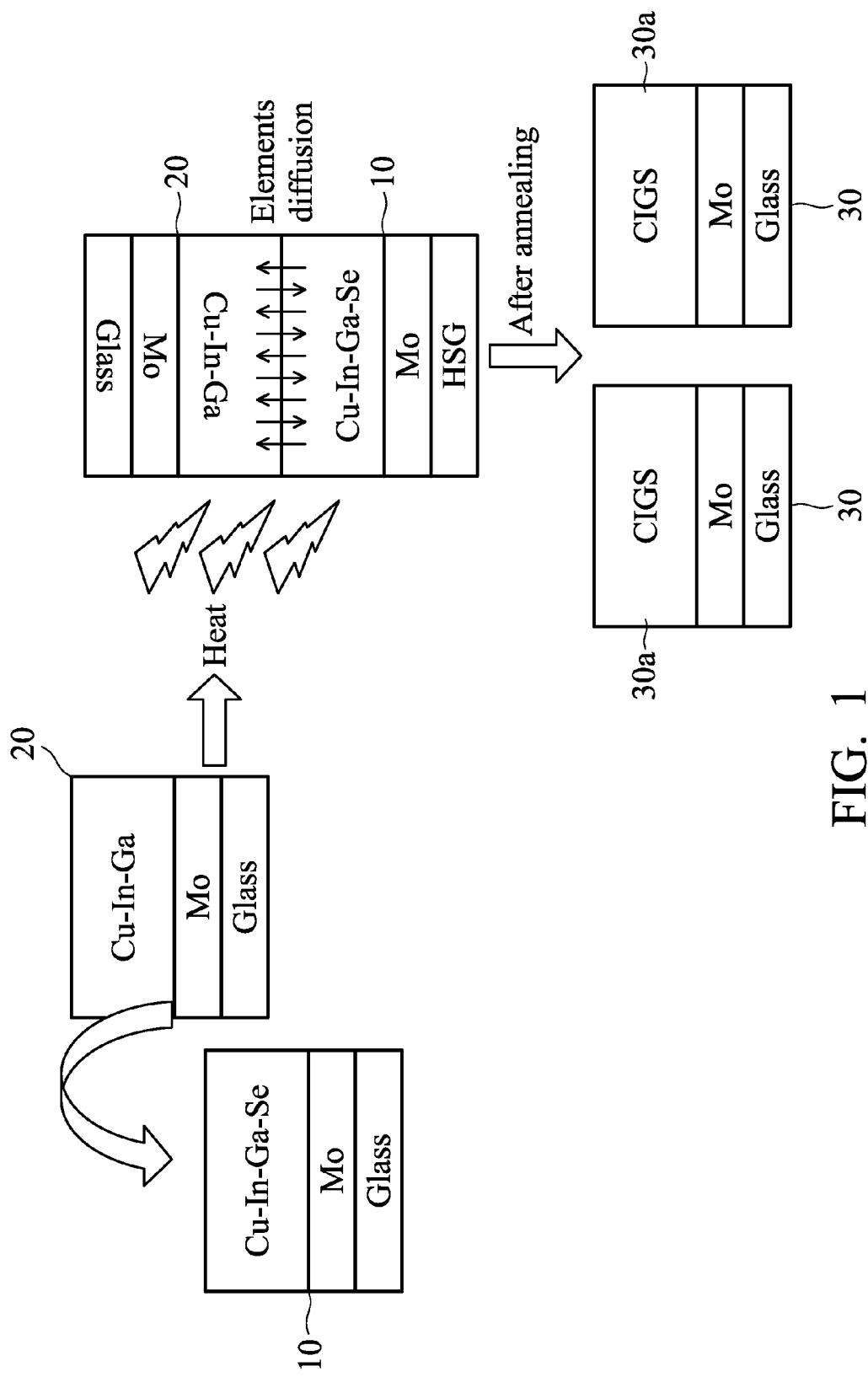
FIG. 1 schematically illustrates a first embodiment of forming a CIGS thin film absorption layer using a proximity assisted synthesis process.

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Various methods of synthesizing chalcopyrite thin films are proposed herein where some elements are supplied from proximity films during high temperature annealing. Cu, In, Ga, and Se can be deposited together or individually onto substrates to form precursor films. Two different compositions or the same composition precursor films are placed face-to-face and spaced a small distance from one another or placed in direct contact. The two precursor films are then annealed to synthesize chalcopyrite thin films with or without Se vapor or H$_2$Se or H$_2$S gas in a vacuum or with an inert gas. Mechanical pressure can also be applied or the environmental pressure can be increased above ambient. During the process, elements (Cu, In, Ga, Se, S, Na, Sb, Bi or other elements) inter-diffuse or interchange between the films during annealing to modify the precursor compositions. That is, an element supplying precursor film can provide elements to a major process precursor film that are insufficient in the original major process precursor film and/or reduce excess elements in the major process precursor film. After annealing, two separate films are obtained, at least one of which is a desired chalcopyrite film and, in embodiments, the other film can be reused for subsequent process runs. The methods allow for accurate control of the reaction pathway. Moreover, there is no significant loss of Se from precursor films due to evaporation. Therefore, the amount of Se used in the process can be decreased.

The methods described herein can also be used to provide extrinsic dopants, such as Na, Sb or Bi, to improve device performance.

As used herein, "stoichiometric CIGS" is Cu(In,Ga)Se$_2$ that conforms to the following: Cu/(In+Ga)=0.8~1 and In+Ga=1. Stoichiometric CIGS can also be considered a single phased CIGS, meaning there is no second phase such as copper selenide, indium selenide or gallium selenide. Non-stoichiometric CIGS includes stoichiometric CIGS and at least one second phase. As also used herein, a layer such as "Cu—In—Ga—Se" or the like means a mixture of Cu, In, Ga and Se elements. These elements are un-reacted or exist as alloys (e.g., Cu—In or Cu—Ga) or binary compounds (e.g., Cu$_R$Se or In$_2$Se$_3$) and are not CIGS.

FIG. 1 illustrates a first method of synthesizing a thin film CIGS absorption layer for a photovoltaic device. In this first method, first precursor and second precursors 10, 20 are provided. Each precursor includes a substrate, such as glass with a layer of molybdenum (Mo) thereon. Though glass is illustrated as one example of a substrate, other substrates, such as flexible polysilicon substrates, may be used in some embodiments. The Mo layer serves as a bottom electrode layer in the finished photovoltaic device. The first precursor 10 includes a top layer including a precursor film containing Cu, In, Ga and Se (Cu—In—Ga—Se). In embodiments, the constituent elements are provided in the following proportions: Cu/(In+Ga)=0.5~1.5; Ga/(In+Ga)=0.1~0.5; and Se/(Cu+In+Ga)=2~5. The second precursor 20 includes a top layer having a Cu—In—Ga precursor film. In embodiments, the constituent elements are provided in the following proportions: Cu/(In+Ga)=0.5~1.5; and Ga/(In+Ga)=0.1~0.5. These precursors 10, 20 can be prepared using sputtering methods, reactive sputtering methods, co-evaporation methods or other techniques suitable for forming these films. The top layers are brought in close proximity to one another to form a planar interaction front, e.g., in direct contact or spaced a distance suitable to allow diffusion of elements therebetween (e.g., 300 μm), and heat is applied with or without mechanical and/or environmental pressure. This annealing step causes element diffusion between the top layers of the precursors 10, 20 and reaction of the elements to form a CIGS film. Primarily, Se diffuses from the precursor 10 to the precursor 20. The results of the process is two structures 30 having substantially identical thin film CIGS layers 30a thereon. Because the ratio of Se/(Cu+In+Ga of the first precursor 10 is higher than 2, the additional Se from the first precursor 10 is the source of Se donated to the second precursor for synthesizing the CIGS film. These subassemblies 30 can then be used in forming larger assemblies, such as photovoltaic device assemblies, as described in U.S. Pat. No. 6,559,372, the entirety of which is hereby incorporated by reference herein.

Figure 1A:
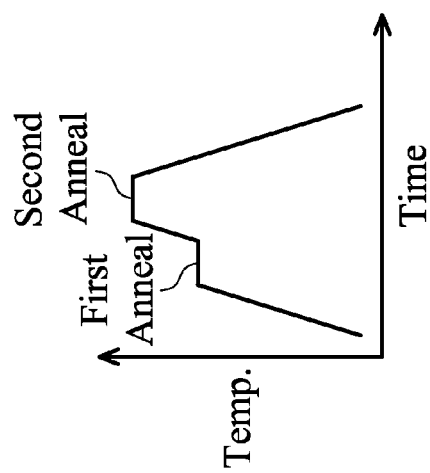
FIG. 1A illustrates a temperature profile for an anneal process within the method illustrated by FIG. 1.

FIG. 1A illustrates an exemplary temperature profile for the annealing process used in the method of FIG. 1. A two-step anneal is used under the following conditions: (1) first anneal: 0-20% $H_2Se$ in $N_2$ or Ar environment for 10-120 minutes at 400-500° C.; and (2) second anneal: 0-100% (optionally, 0-80% or 0-70%) $H_2S$ in $N_2$ or Ar environment for 10-120 minutes at 450-600° C.

Figure 2A:
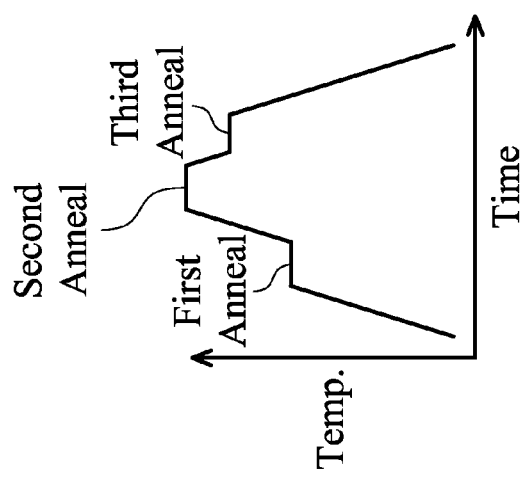
FIG. 2A illustrates a temperature profile for an anneal process within the methods illustrated by FIGS. 2 and 3.
Figure 2:
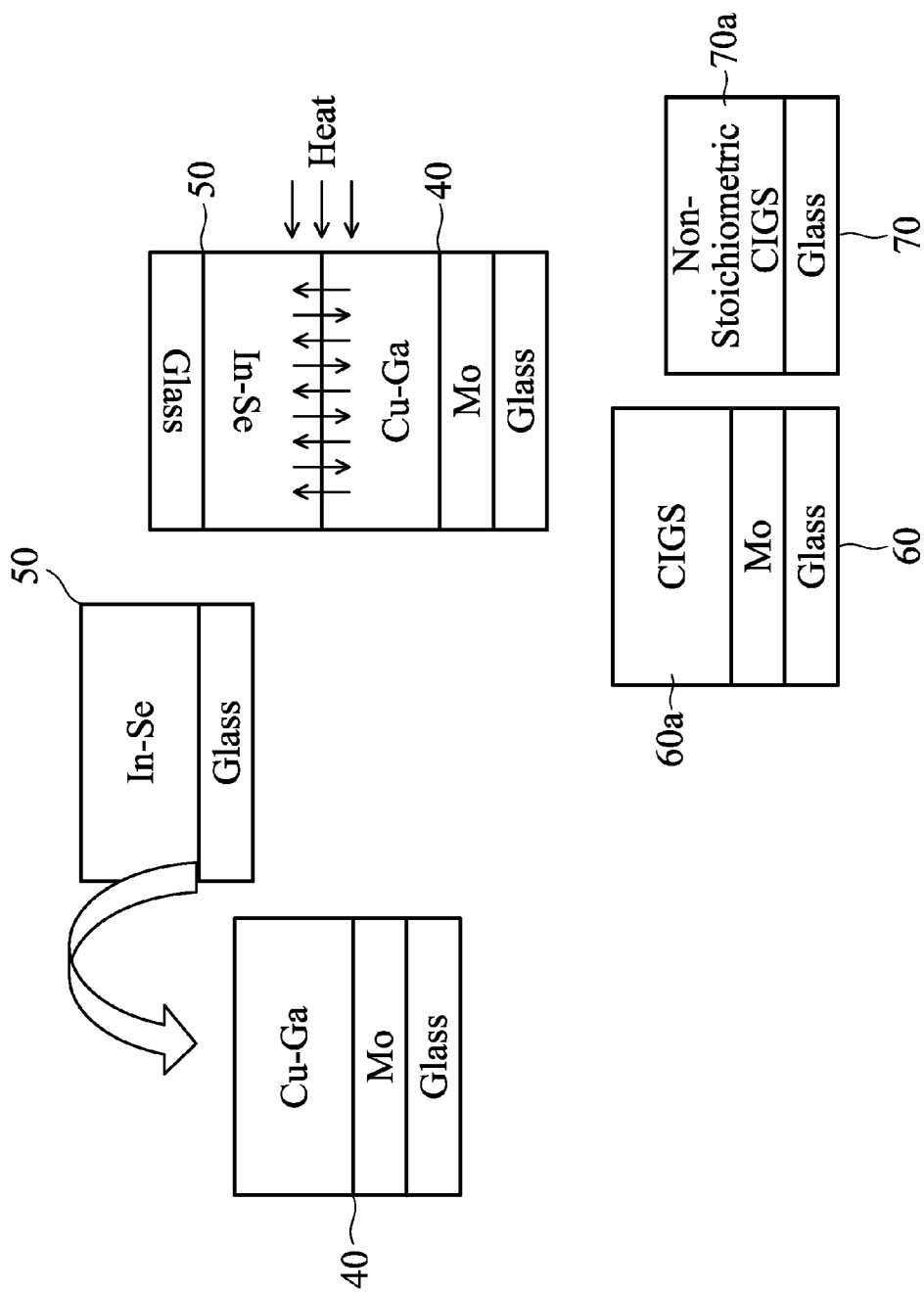
FIG. 2 schematically illustrates a second embodiment of forming a CIGS thin film absorption layer using a proximity assisted synthesis process.

FIG. 2 illustrates a second method of synthesizing a thin film CIGS absorption layer for a photovoltaic device. In this embodiment a first precursor 40 is provided including a glass substrate, Mo electrode layer and a top layer including a Cu—Ga precursor film. In embodiments, the constituent elements are provided in the following proportions: Cu/Ga=1~10. In certain embodiments this ratio is 2.5~5. A second precursor 50 is also provided including a glass substrate and a top layer including an In—Se precursor film. In embodiments, the proportion of the constituent elements of this precursor is In/Se=0.1~1. In embodiments, the total ratio of the constituent elements for the first precursor and second precursor is: Cu/(In+Ga)=0.5~1.5; Ga/(In+Ga)=0.1~0.5; and Se/(Cu+In+Ga)=2~5. This second precursor does not include a Mo electrode layer because it will not be used as part of a finished photovoltaic device. These precursors 40, 50 can be prepared using sputtering methods, reactive sputtering methods, or co-evaporation methods, for example. The top layers are brought in close proximity to one another, e.g., in direct contact or spaced about 300 μm from one another, and heat is applied with or without mechanical and/or environmental pressure. This annealing step causes element diffusion between the top layers of the precursors 40, 50 and a reaction to form a CIGS layer. Specifically, In and Se diffuse to the top layer of the precursor 40 and Cu and Ga diffuse to the top layer of the precursor 50. The In and Se diffuses from precursor 50 to precursor 40 more quickly than the Ga and Cu diffuse from the precursor 40 to precursor 50. The result of the process is two structures 60, 70. The first structure 60 includes a stoichiometric thin film CIGS layer 60a for use in a photovoltaic device. The second structure 70 includes non-stoichiometric CIGS layer 70a. This layer can be used as precursor film in subsequent CIGS forming processes, with or without additional processing, such as those described herein. For example, this non-stoichiometric CIGS film may be a Cu-poor Cu—In—Ga—Se film where Cu/(In+Ga)=0.5, Ga/(In+Ga)=0.1, and Se/(Cu+In+Ga)=3. This film could be directly used, with or without redeposition of In and Se, in a next process run as the second precursor 50 to provide In and Se.

FIG. 2A illustrates an exemplary temperature profile for the annealing process used in the method of FIG. 2. A three-step anneal is used under the following conditions: (1) first anneal: 0-20% $H_2Se$ in $N_2$ or Ar environment for 10-120 minutes at 400-500° C.; (2) second anneal: $N_2$ or Ar environment for 10-120 minutes at 500-600° C.; and (3) third anneal: 0-100% (optionally, 0-80% or 0-70%) $H_2S$ in $N_2$ or Ar environment for 10-120 minutes at 450-550° C.

Figure 3:
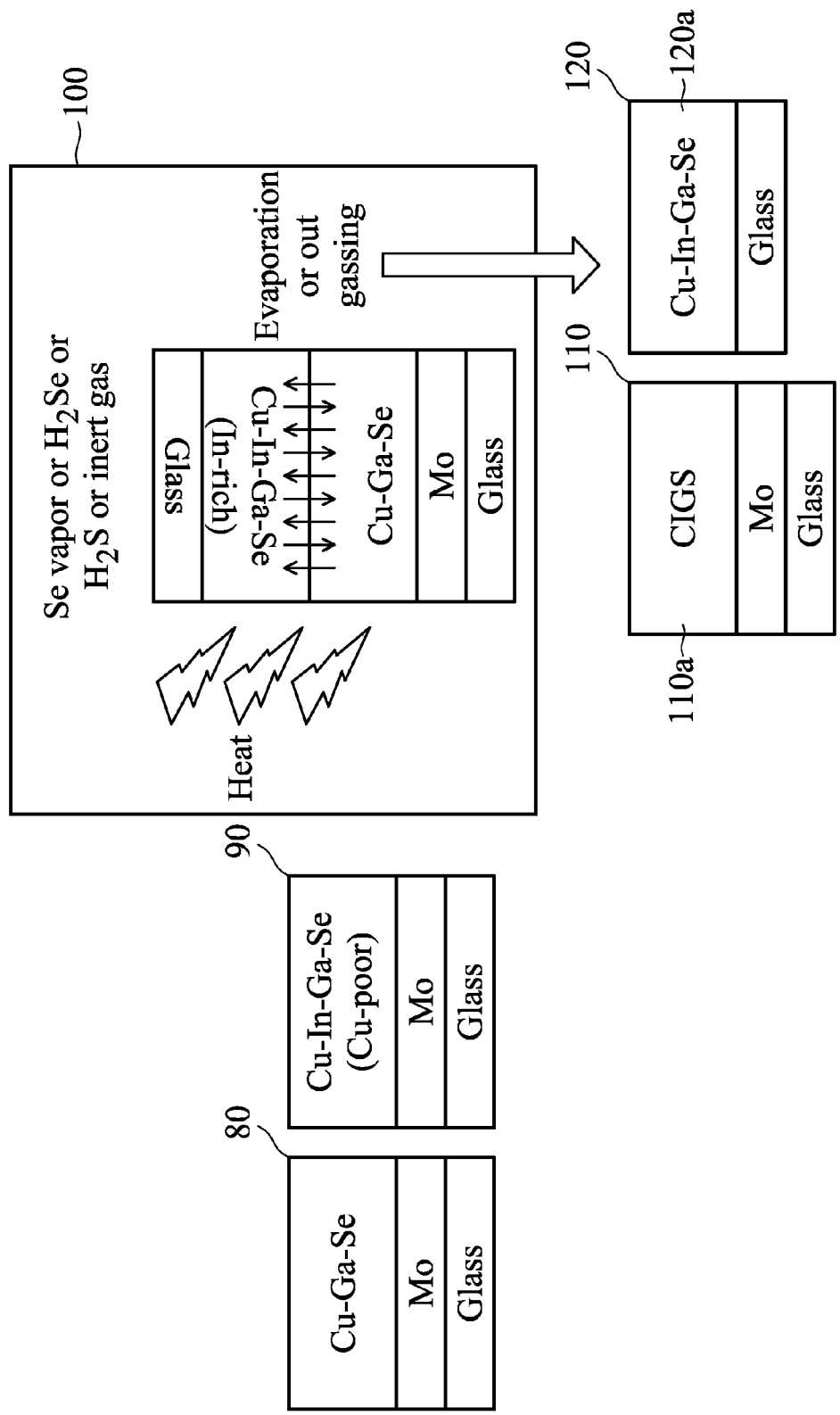
FIG. 3 schematically illustrates a third embodiment of forming a CIGS thin film absorption layer using a proximity assisted synthesis process.

FIG. 3 illustrates a third method of synthesizing a thin film CIGS absorption layer for a photovoltaic device. In this embodiment a first precursor 80 is provided including a glass substrate, Mo electrode layer and a top layer including a Cu—Ga—Se precursor film. A second precursor 90 is also provided including a glass substrate and a top layer containing a Cu—In—Ga—Se precursor film. This top layer is Cu-poor and serves primarily as an In donor for the first precursor 80. In embodiments, the total ratio of the first precursor and second precursor is as follows: Cu/(In+Ga)=0.5~1.5; Ga/(In+Ga)=0.1~0.5; Se/(Cu+In+Ga)=2~5; and Cu-poor Cu—In—Ga—Se means Cu/(In+Ga)<1. These precursors 80, 90 can be prepared using sputtering methods, reactive sputtering methods, or co-evaporation methods. The top layers are placed within a reaction furnace chamber 100 and brought in close proximity to one another, e.g., in direct contact or spaced about 300 μm from one another. Heat is applied, with or without mechanical and/or environmental pressure, in the presence of Se vapor and/or $H_2Se$, $H_2S$ or inert gas environment. It should be understood that similar environments can also be used in other embodiments described herein, though not shown. This annealing step causes element diffusion between the top layers of the precursors 80, 90 and the incorporation of Se and/or S into the layers and a reaction to form a CIGS film. The three step anneal described above in connection with FIG. 2A can be used with the process of FIG. 3. Primarily, In diffuses from the Cu-poor top layer of precursor 90 to the In-deficient top layer of precursor 80. The result of this processing is two structures 110a, 120a. The first structure 110a includes a stoichiometric thin film CIGS layer 110a for use in a photovoltaic device. The second structure 120a includes the remnants of Cu—In—Ga—Se precursor film layer 120a. This layer can be used as precursor film in subsequent CIGS forming processes, e.g., subsequent runs of the process of FIG. 3. The layer 120a of the structure 120 can be further processed to provide it with In (e.g., by sputtering) to form an indium rich Cu—In—Ga—Se layer precursor film and used as a precursor 90 in the process illustrated in FIG. 3. As illustrated in FIG. 3, because there is a space between the two precursors, the elements cannot directly diffuse between the films. As such, it is a vapor that reacts with the other film.

Figure 4A:
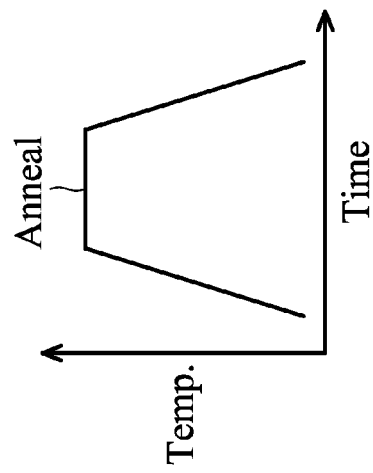
FIG. 4A illustrates a temperature profile for an anneal process within the method illustrated by FIG. 4.
Figure 4:
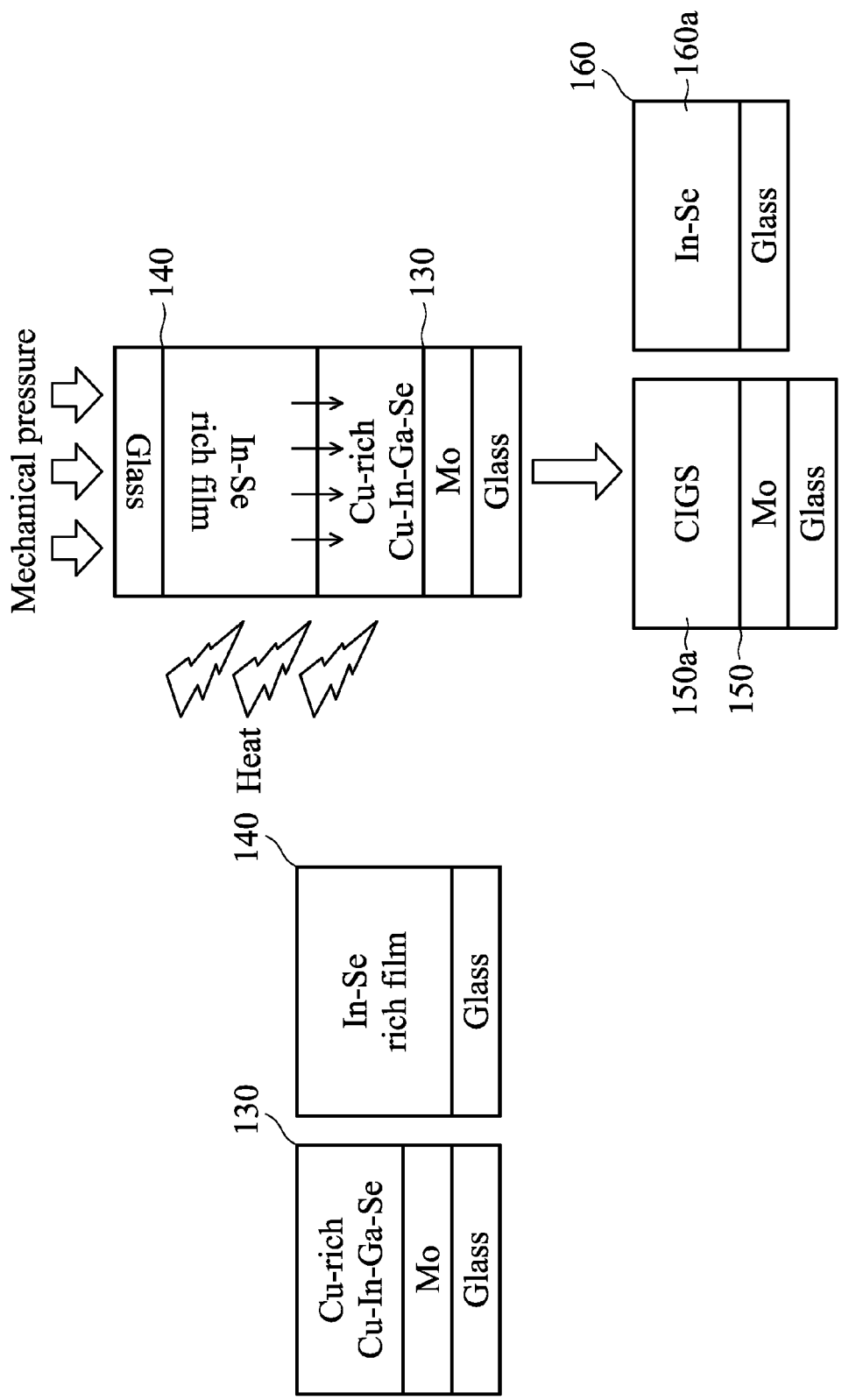
FIG. 4 schematically illustrates a fourth embodiment of forming a CIGS thin film absorption layer using a proximity assisted synthesis process.

FIG. 4 illustrates a fourth method of synthesizing a thin film CIGS absorption layer for a photovoltaic device. In this embodiment a first precursor 130 is provided including a glass substrate, Mo electrode layer and a top layer including Cu-rich precursor film of Cu—Ga—In—Se. In embodiments, by "Cu-rich" Cu—In—Ga—Se, it is meant that Cu/(In+Ga)>1. A second precursor 140 is also provided including a glass substrate and a top layer including an In—Se rich precursor film. In embodiments, the total ratio of the first precursor and second precursor conforms to the following: Cu/(In+Ga)=0.5~1.5; Ga/(In+Ga)=0.1~0.5; and Se/(Cu+In+Ga)=2~5. By "In—Se rich" it is meant that the film contains and abundant source of indium selenide compound. These precursors 130, 140 can be prepared using sputtering methods, reactive sputtering methods, or co-evaporation methods. The top layers are brought in direct contact with one another and heat is applied along with mechanical pressure. Though not shown, mechanical pressure can also be applied in other embodiment where the precursors are brought in direct contact. In this embodiment, the reaction involves the transformation of the Cu-rich film to a Cu-poor film by In directly diffusing from the second precursor to the first precursor. It is desirable to first control the reaction to take place in the Cu-rich film, which leads to larger grain size, and then change the surface condition to Cu-poor for better electrical properties with good diode quality. Though diffusion in this embodiment is bidirectional, of note is that this annealing step causes element diffusion from the top layer of the precursor 140 to the top layer of the precursor 130 and a reaction to form a CIGS film. Specifically, In (as well as Se) diffuse to the top layer of the precursor 130. Two structures 150, 160 result from this process. The first structure 150 includes a stoichiometric thin film CIGS layer 150a for use in a photovoltaic device. The second structure 160 includes an In—Se depleted film 160a. Indium and Se can be redeposited on layer 160a and the resulting structure can then be reused as a precursor 140 in subsequent CIGS forming processes in accordance with the method of FIG. 4.

FIG. 4A illustrates an exemplary temperature profile for the annealing process used in the method of FIG. 1. A one-step anneal is used under the following conditions: anneal with 0-20% $H_2Se$ in $N_2$ or Ar environment for 10-120 minutes at 400-600° C.

As described herein, in each of the methods of FIGS. 1-4 some elements that are either missing or deficient from the major process precursor film are provided by diffusion from a proximity film and/or elements that are in excess in the major process precursor film are donated from the major process precursor film, thereby providing the desired CIGS film. Elements can diffuse quickly and the result is either two usable CIGS films or a usable CIGS film and a byproduct precursor that is reusable as is or after subsequent processing. This approach to CIGS thin film formation allows for the reaction pathway to be carefully controlled. For example, as described in connection with FIG. 4, beginning with a copper rich CIGS film (i.e., a CIGS film with some copper selenide), In elements can diffuse from the proximity film to finish the surface treatment. During this surface treatment, In from the other film will react with copper selenide to reduce the amount of copper selenide. This treatment will take place due to the composition of two precursors. Moreover, the methods described herein can reduce the amount of Se used in forming the CIGS film. Improved grain growth can be obtained with a flatter gallium profile. Finally, doping with elements such as Na, Bi, S, Sb or other desired dopants can easily be incorporated into the process.

Figure 5:
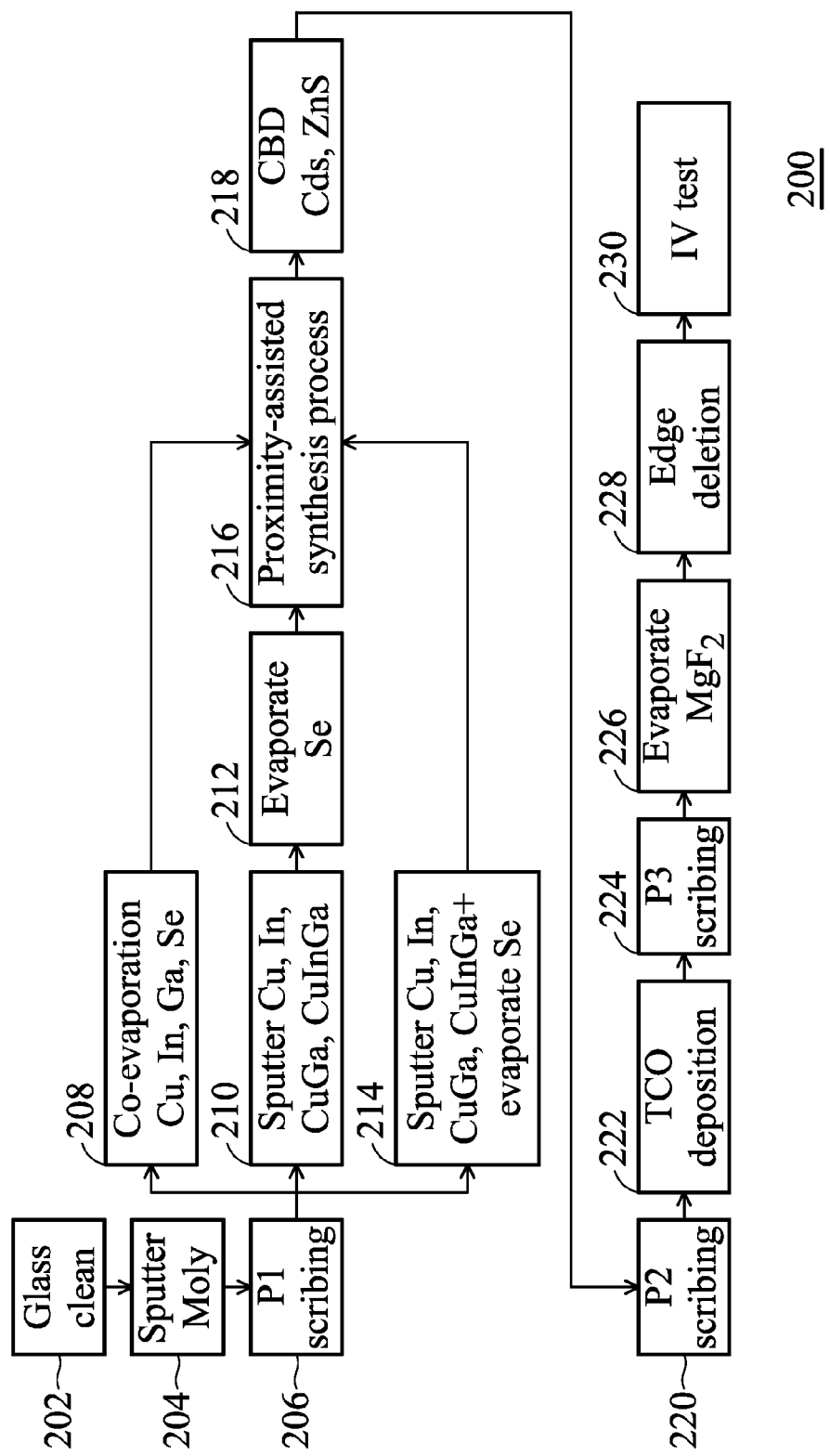
FIG. 5 illustrates a method of forming a photovoltaic device.

FIG. 5 illustrates an embodiment of a method 200 of manufacturing a photovoltaic device having a thin film CIGS absorption layer. Some embodiments of the method include the following steps:

At step 202, a glass substrate is provided and cleaned.

At step 204, a back contact layer, such as a layer of Mo, is deposited on the cleaned glass substrate by sputtering.

At step 206, interconnections (i.e., P1 line) for the solar module are formed. For example, a laser can be used to cut the Mo layer.

For methods that start with a precursor having a Cu—In—Ga—Se layer (e.g., precursor 10 and 20 of FIG. 1 or precursor 130 and 140 of FIG. 4), the Cu—In—Ga—Se layer is prepared by, for example: co-evaporating Cu, In, Ga and Se onto the substrate (step 208); sputtering Cu, In, CuGa and/or CuInGa onto the substrate (step 210) followed by evaporating Se onto the substrate (step 212); or sputtering Cu, In, CuGa, and/or CuInGa while evaporating Se (step 214). Assuming the method of FIG. 2 is being used, where the precursor 40 includes a Cu—Ga layer, then step 208 can be used to co-evaporate just Cu and Ga onto the substrate. Alternative, CuGa could be sputtered using step 210 without subsequent step 212. Assuming the method of FIG. 3 is being used, where the precursor 80 includes a Cu—Ga—Se layer, then either steps 210 and 212 or step 214 can be used to form this layer. Of course, similar processes can be employed to prepare the precursor films of second precursors 20, 50, 90 and 140 of FIGS. 1-4.

At step 216, a proximity-assisted CIGS film synthesis process is performed as described above in connection with FIGS. 1-4, which results in a subassembly 30, 60, 110, 150 having the desired thin film CIGS absorber layer over the substrate and structure and reusable precursor structures 70, 120, 160.

At step 218, a layer of CdS or ZnS buffer layer is deposited on top of the CIGS absorber layer, such as by a chemical bath deposition step.

At step 220, additional interconnects (P2 line) for the solar module are formed. For example, a mechanical scribing operation can be performed to cut the CIGS/CdS layers.

At step 222, a TCO (transparent conducting oxide (i.e., optically transparent and electrically conductive) layer is deposited. In embodiments, the TCO may be a tin-doped indium oxide or aluminum doped zinc oxide. This layer forms the front contact for the CIGS solar cells.

At step 224, additional interconnects (P3 line) for the solar module are formed. For example, a mechanical scribing operation can be performed to cut the TCO/CdS/CIGS layers.

At step 226, an optional anti-reflection layer is formed over the TCO layer, such as by evaporating $MgF_2$.

At step 228, edges are deleted using a laser.

At step 230, the solar cell can be tested, such as using an I-V test.

It should be understood that in embodiments Sulfur can be introduce, for example, during the second anneal in FIG. 1A or the third anneal in FIG. 2A via a $H_2S$ gas. Sulfur also can be incorporate into a precursor by evaporating a sulfur vapor in a selenium vapor. In embodiments, if sulfur is added the CIGS will become CIGSS: Cu/(In+Ga)=0.8~1; In+Ga=1; and Se+S=1. In all embodiments described herein, Se can be partially replaced by S.

Embodiments of a method of forming a CIGS film absorption layer for a solar cell include the following steps: providing a first precursor comprising a first substrate having a major process precursor film formed thereon, the major process precursor film containing two or more of Cu, In, Ga, and Se; providing a second precursor comprising a second substrate having an element supplying precursor film formed thereon, the element supply precursor film containing two or more of Cu, In, Ga and Se; orienting the precursors with the major process precursor film and element supplying precursor film facing one another so as to allow diffusion of elements between the films during annealing; annealing the oriented films; and separating the precursors after the annealing step, wherein the CIGS film is formed over the first substrate and either a CIGS film or a precursor film containing two or more of Cu, In, Ga, and Se remains over the second substrate.

In certain embodiments, a method of forming a stoichiometric CIGS film absorption layer for a solar cell, includes the steps of: (a) providing a first structure, the first structure comprising a first substrate, a bottom electrode layer formed over the first substrate, and a first precursor film formed thereon, the first precursor film containing two or more of Cu, In, Ga, and Se; (b) providing a second structure comprising a second substrate having a second precursor film formed thereon, the second precursor film containing two or more of Cu, In, Ga and Se; (c) orienting the structures with the first and second precursor films facing one another so as to allow diffusion of elements between the films during annealing; (d) annealing the oriented films; (e) separating the structures after the annealing step, wherein the stoichiometric CIGS film is formed over the first substrate and remaining precursor film containing two or more of Cu, In, Ga, and Se remains over the second substrate; and (f) repeating steps (a) to (e) using the remaining precursor film, with or without further processing, as the second precursor film in forming a stoichiometric CIGS film over a third substrate.

Certain embodiments of a method of forming a stoichiometric CIGS film absorption layer for a solar cell includes the steps of: providing a first structure, the first structure comprising a first substrate, a bottom electrode layer formed over the first substrate, and a first precursor film formed thereon, the first precursor film containing two or more of Cu, In, Ga, and Se; providing a second structure comprising a second substrate having a second precursor film formed thereon, the second precursor film containing two or more of Cu, In, Ga and Se; orienting the structures with the first and second precursor films facing one another so as to allow diffusion of elements between the films during annealing; annealing the oriented films; and separating the structures after the annealing step, wherein the stoichiometric CIGS film is formed over the first substrate and remaining layer comprising at least one of Cu, In, Ga, and/or Se is disposed over the second substrate.

Although examples are illustrated and described herein, embodiments are nevertheless not limited to the details shown, since various modifications and structural changes may be made therein by those of ordinary skill within the scope and range of equivalents of the claims.

What is claimed is:

1. A method of forming a CIGS film absorption layer for a solar cell, comprising the steps of:
    providing a first precursor comprising a first substrate having a major process precursor film formed thereon, the major process precursor film containing two or more of Cu, In, Ga, and Se;
    providing a second precursor comprising a second substrate having an element supplying precursor film formed thereon, the element supply precursor film containing two or more of Cu, In, Ga and Se;
    orienting the precursors with the major process precursor film and element supplying precursor film facing one another so as to allow diffusion of elements between the films during annealing;
    annealing the oriented films; and
    separating the precursors after the annealing step, wherein the CIGS film is formed over the first substrate and either a CIGS film or a precursor film containing two or more of Cu, In, Ga, and Se remains over the second substrate.

2. The method of claim 1, wherein the orienting step places the films in direct contact with one another.

3. The method of claim 1, wherein the orienting step places the films spaced in close proximity with one another.

4. The method of claim 1, further comprising exposing the oriented films to $H_2Se$ or $H_2S$ during the annealing.

5. The method of claim 1, wherein the major process precursor film comprises Cu—In—Ga—Se and the element supplying precursor film comprises Cu—In—Ga.

6. The method of claim 5, wherein the remaining film over the second substrate is a stoichiometric CIGS film.

7. The method of claim 6, wherein the first and second substrates have an electrode layer formed between the substrates and the major process precursor film and element supplying precursor film, respectively.

8. The method of claim 5, wherein the annealing step comprises a two-step anneal, with a first anneal at at least 400° C. for a first period of time and a second anneal following the first anneal at a higher temperature of at least 450° C. for a second period of time.

9. The method of claim 1, wherein the major process precursor film comprises Cu—Ga and the element supplying precursor film comprises In—Se.

10. The method of claim 5, wherein the remaining film over the second substrate is a non-stoichiometric CIGS film.

11. The method of claim 9, wherein the annealing step comprises a three step anneal, with a first anneal at at least 400° C. for a first period of time, a second anneal following the first anneal at a higher temperature of at least 500° C. for a second period of time, and a third anneal following the second anneal at a temperature lower than the second anneal but higher than the first anneal.

12. The method of claim 1, wherein the major process precursor film comprises Cu—Ga—Se and the element supplying precursor film comprises Cu-poor Cu—In—Ga—Se.

13. The method of claim 12, wherein the remaining film over the second substrate comprises Cu—In—Ga—Se.

14. The method of claim 12, wherein the annealing step comprises a three step anneal, with a first anneal at at least 400° C. for a first period of time, a second anneal following the first anneal at a higher temperature of at least 500° C. for a second period of time, and a third anneal following the second anneal at a temperature lower than the second anneal but higher than the first anneal.

15. The method of claim 1, wherein the major process precursor film comprises a Cu-rich Cu—In—Ga—Se and the element supplying precursor film comprises In—Se.

16. The method of claim 15, wherein the remaining film over the second substrate comprises In—Se.

17. The method of claim 1, further comprising using the remaining film as the element supplying precursor film in forming a CIGS film absorption layer over a third substrate.

18. The method of claim 1, wherein a total ratio of Cu, In, Ga and Se provided in the major process precursor film and element supply precursor film is: $Cu/(In+Ga)=0.5\sim1.5$; $Ga/(In+Ga)=0.1\sim0.5$; and $Se/(Cu+In+Ga)=2\sim5$.

19. A method of forming a stoichiometric CIGS film absorption layer for a solar cell, comprising the steps of:
    (a) providing a first structure, the first structure comprising a first substrate, a bottom electrode layer formed over the first substrate, and a first precursor film formed thereon, the first precursor film containing two or more of Cu, In, Ga, and Se;

(b) providing a second structure comprising a second substrate having a second precursor film formed thereon, the second precursor film containing two or more of Cu, In, Ga and Se;

(c) orienting the structures with the first and second precursor films facing one another so as to allow diffusion of elements between the films during annealing;

(d) annealing the oriented films;

(e) separating the structures after the annealing step, wherein the stoichiometric CIGS film is formed over the first substrate and remaining precursor film containing two or more of Cu, In, Ga, and Se remains over the second substrate; and (f) repeating steps (a) to (e) using the remaining precursor film, with or without further processing, as the second precursor film in forming a stoichiometric CIGS film over a third substrate.

20. The method of claim 19, wherein the first precursor film comprises Cu—In—Ga—Se, Cu—Ga, or Cu—Ga—Se, and the second precursor film comprises Cu—In—Ga, In—Se, or Cu—In—Ga—Se.

21. A method of forming a stoichiometric CIGS film absorption layer for a solar cell, comprising the steps of:

providing a first structure, the first structure comprising a first substrate, a bottom electrode layer formed over the first substrate, and a first precursor film formed thereon, the first precursor film containing two or more of Cu, In, Ga, and Se;

providing a second structure comprising a second substrate having a second precursor film formed thereon, the second precursor film containing two or more of Cu, In, Ga and Se;

orienting the structures with the first and second precursor films facing one another so as to allow diffusion of elements between the films during annealing;

annealing the oriented films; and separating the structures after the annealing step, wherein the stoichiometric CIGS film is formed over the first substrate and a remaining layer comprising at least one of Cu, In, Ga, and Se is disposed over the second substrate.

\* \* \* \* \*